United States Patent
Iguchi

(10) Patent No.: US 12,443,107 B2
(45) Date of Patent: Oct. 14, 2025

(54) METHOD FOR INSPECTING PHOTOSENSITIVE COMPOSITION AND METHOD FOR PRODUCING PHOTOSENSITIVE COMPOSITION

(71) Applicant: FUJIFILM Corporation, Tokyo (JP)

(72) Inventor: Naoya Iguchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 586 days.

(21) Appl. No.: 17/953,831

(22) Filed: Sep. 27, 2022

(65) Prior Publication Data
US 2023/0108447 A1    Apr. 6, 2023

(30) Foreign Application Priority Data
Sep. 28, 2021   (JP) ................. 2021-158177

(51) Int. Cl.
    *G03F 7/20*     (2006.01)
    *G03F 7/38*     (2006.01)

(52) U.S. Cl.
    CPC ............. *G03F 7/2022* (2013.01); *G03F 7/38* (2013.01)

(58) Field of Classification Search
    CPC ..... G03F 7/38; G03F 7/30; G03F 7/20; G03F 7/2022; G03F 7/2002; G03F 7/2004
    See application file for complete search history.

(56) References Cited

U.S. PATENT DOCUMENTS

| | | |
|---|---|---|
| 11,181,823 B2 | 11/2021 | Hatakeyama et al. |
| 2008/0204734 A1 | 8/2008 | Dixon et al. |

FOREIGN PATENT DOCUMENTS

| | | |
|---|---|---|
| CN | 102402137 A | 4/2012 |
| JP | 2012-226119 | * 11/2012 |

(Continued)

OTHER PUBLICATIONS

English translation of JP Publication 2012-226119, Nov. 2012.*
Communication dated Mar. 18, 2025 in Japanese Application No. 2021-158177.

*Primary Examiner* — Brittany L Raymond
(74) *Attorney, Agent, or Firm* — Sughrue Mion, PLLC

(57) ABSTRACT

Provided are a method for inspecting a photosensitive composition, the method being able to more accurately evaluate photosensitive compositions produced at different times and including the same materials, and a method for producing a photosensitive composition.

The method for inspecting a photosensitive composition includes a first step of performing exposure treatment, heat treatment, and development treatment in this order on a dummy substrate including a first photosensitive composition layer formed using a first photosensitive composition; a second step of performing exposure treatment, heat treatment, and development treatment under the same conditions as in the first step on a first evaluation substrate including the first photosensitive composition layer to form a pattern; a third step of performing exposure treatment, heat treatment, and development treatment under the same conditions as in the first step on a second evaluation substrate including a second photosensitive composition layer formed using a second photosensitive composition to form a pattern; and a fourth step of determining whether a difference between a dimension of the pattern obtained in the second step and a dimension of the pattern obtained in the third step is within an acceptable range. The first photosensitive composition and the second photosensitive composition are compositions including the same materials and produced in different lots.

20 Claims, 6 Drawing Sheets

(56) References Cited

FOREIGN PATENT DOCUMENTS

| | | | |
|---|---|---|---|
| JP | 2012-226119 | A | 11/2012 |
| JP | 2020-046662 | A | 3/2020 |

\* cited by examiner

METHOD FOR INSPECTING PHOTOSENSITIVE COMPOSITION AND METHOD FOR PRODUCING PHOTOSENSITIVE COMPOSITION

CROSS-REFERENCE TO RELATED APPLICATIONS

The present application claims priority under 35 U.S.C. § 119 to Japanese Patent Application No. 2021-158177, filed on Sep. 28, 2021. The above application is hereby expressly incorporated by reference, in its entirety, into the present application.

BACKGROUND OF THE INVENTION

1. Field of the Invention

The present invention relates to a method for inspecting photosensitive compositions that are compositions including the same materials and produced in different lots and a method for producing a photosensitive composition.

2. Description of the Related Art

In a process for producing a semiconductor device such as an integrated circuit (IC) or a large scale integrated circuit (LSI), lithography micromachining using a photosensitive composition has been conventionally performed. In recent years, with increasing integration of integrated circuits, formation of ultrafine patterns in submicron regions or quarter-micron regions has been required. Accordingly, the exposure wavelength tends to be shortened from g-line to i-line, and further to ArF excimer laser light and KrF excimer laser light. Furthermore, currently, lithography using an electron beam or extreme ultraviolet (EUV) light as well as excimer laser light has also been developed.

For example, JP 2020-046662A discloses a resist material having a predetermined composition, the resist material being exposed to ArF excimer laser light having a wavelength of 193 nm or KrF excimer laser light having a wavelength of 248 nm.

SUMMARY OF THE INVENTION

In general, it is desired that there be little difference in performance between production lots when a photosensitive composition is produced. However, when raw materials for the photosensitive composition, such as an acid decomposable resin and a photoacid generator, are produced in different lots, the photosensitive composition, even if produced at the same raw material compositional ratio as before, has sometimes exhibited performance different from that of a previous photosensitive composition.

For this reason, there are cases where photosensitive compositions of different lots produced at different times are used, and evaluation of whether there is a difference in performance between the production lots has been performed.

In the evaluation of the difference in performance between the production lots, two photosensitive compositions produced at different times are first provided. Next, evaluation substrates each having a layer formed using each photosensitive composition are produced. Exposure treatment and development treatment are continuously performed on each evaluation substrate, and dimensions of patterns obtained are used to evaluate the photosensitive compositions. Although the evaluation has been made, it has been impossible to accurately evaluate the photosensitive compositions produced in different lots due to great variation in the dimensions of the patterns.

An object of the present invention is to provide a method for inspecting a photosensitive composition, the method being able to more accurately evaluate compositions including the same materials and produced in different lots, and a method for producing a photosensitive composition.

To achieve the above object, one aspect of the present invention provides a method for inspecting a photosensitive composition. The method includes a first step of performing exposure treatment, heat treatment, and development treatment in this order on a dummy substrate including a first photosensitive composition layer formed using a first photosensitive composition; a second step of performing exposure treatment, heat treatment, and development treatment under the same conditions as in the first step on a first evaluation substrate including the first photosensitive composition layer to form a pattern; a third step of performing exposure treatment, heat treatment, and development treatment under the same conditions as in the first step on a second evaluation substrate including a second photosensitive composition layer formed using a second photosensitive composition to form a pattern; and a fourth step of determining whether a difference between a dimension of the pattern obtained in the second step and a dimension of the pattern obtained in the third step is within an acceptable range. The first photosensitive composition and the second photosensitive composition are compositions including the same materials and produced in different lots.

Preferably, the method includes between the second step and the third step, a fifth step of performing exposure treatment, heat treatment, and development treatment under the same conditions as in the first step in this order on a dummy substrate including the second photosensitive composition layer.

Preferably, the first step is a step of exposing the dummy substrate including the first photosensitive composition layer in an exposure unit, heating the exposed dummy substrate in a heating unit, and developing the heated dummy substrate in a development unit, the second step is a step of exposing the first evaluation substrate including the first photosensitive composition layer in the exposure unit under the same conditions as in the first step, heating the exposed first evaluation substrate in the heating unit under the same conditions as in the first step, and developing the heated first evaluation substrate in the development unit under the same conditions as in the first step to form a pattern, and the third step is a step of exposing the second evaluation substrate including the second photosensitive composition layer in the exposure unit under the same conditions as in the first step, heating the exposed second evaluation substrate in the heating unit under the same conditions as in the first step, and developing the heated second evaluation substrate in the development unit under the same conditions as in the first step to form a pattern.

Preferably, the fifth step is a step of exposing the dummy substrate including the second photosensitive composition layer in an exposure unit under the same conditions as in the first step, heating the exposed dummy substrate in a heating unit under the same conditions as in the first step, and developing the heated dummy substrate in a development unit under the same conditions as in the first step.

Preferably, in the first step, one dummy substrate is treated in the exposure unit, the heating unit, and the development unit.

Preferably, in the second step, one first evaluation substrate is treated in the exposure unit, the heating unit, and the development unit.

Preferably, in the third step, one second evaluation substrate is treated in the exposure unit, the heating unit, and the development unit.

Preferably, in the fifth step, one dummy substrate is treated in the exposure unit, the heating unit, and the development unit.

Preferably, the time period between the second step and the third step is 8 minutes or more.

Preferably, the first step is performed a plurality of times.

One aspect of the present invention provides a method for producing a photosensitive composition, the method including the method for inspecting a photosensitive composition.

The present invention can provide a method for inspecting a photosensitive composition, the method being able to more accurately evaluate compositions including the same materials and produced in different lots, and a method for producing a photosensitive composition.

DESCRIPTION OF THE PREFERRED EMBODIMENTS

Figure 1:
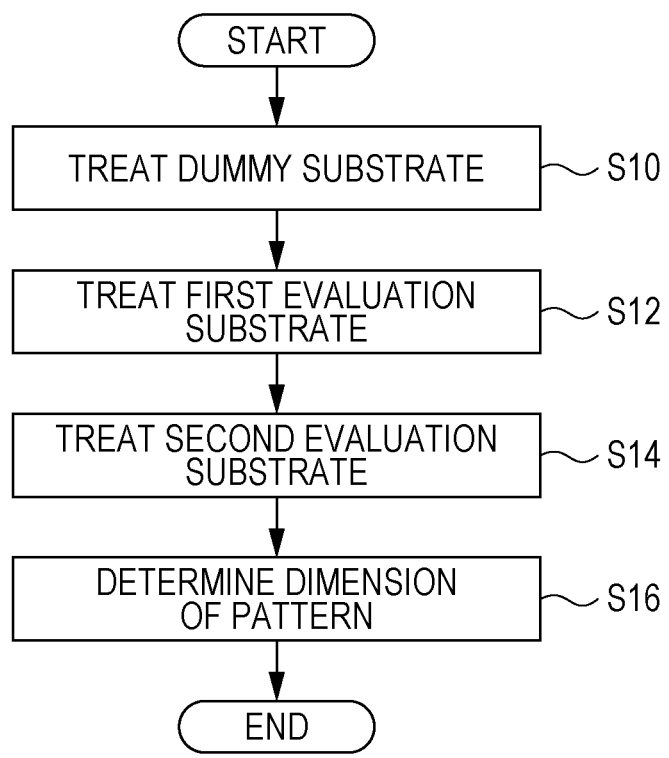
FIG. 1 is a flowchart showing a first example of a method for inspecting a photosensitive composition according to an embodiment of the present invention.

Hereinafter, based on preferred embodiments illustrated in the attached drawings, a method for inspecting a photosensitive composition and a method for producing a photosensitive composition according to the present invention will be described in detail.

It should be noted that figures described below are illustrative of the present invention and are not intended to limit the present invention.

In the following, any numerical range expressed as " . . . to . . . " includes the values on both sides. For example, when $\varepsilon$ is from a value $\varepsilon_a$ to a value $\varepsilon_b$, the range of $\varepsilon$ is a range including the value $\varepsilon_a$ and the value $\varepsilon_b$, which is expressed by mathematical symbols as $\varepsilon_a \leq \varepsilon \leq \varepsilon_b$.

The terms such as "parallel" each include an error range generally acceptable in the corresponding technical field, unless otherwise specified. The term "the same" includes an error range generally acceptable in the corresponding technical field.

The quality control of a photosensitive composition is based on the premise that the quality evaluation environment is stable, and thus when the quality of a photosensitive composition is evaluated, it is required to stabilize the quality evaluation environment in a constant state. In the present invention, the environment for evaluating the quality of a photosensitive composition is stabilized using a dummy substrate. More specifically, when a substrate having a photosensitive composition layer is exposed, the photosensitive composition layer undergoes a chemical change, and, for example, a portion of a decomposition product volatilizes, resulting in a change in environment before and after the exposure. Accordingly, it has been found that, for example, in the case where exposure treatment, heat treatment, and development treatment of two evaluation samples are sequentially performed, if the exposure treatment of the second evaluation sample is carried out in an apparatus in which the treatments on the first evaluation sample have been performed, a decomposition product and the like derived from the first evaluation sample remain in the apparatus; thus, the treatment environment of the first evaluation sample and the treatment environment of the second evaluation sample are different from each other, and such a difference in atmosphere results in variation in evaluation results. Thus, in the present invention, various treatments carried out on actual evaluation samples are performed using a dummy substrate, so that the treatment atmosphere is constant at the time when the evaluation samples are evaluated. This can solve the variation in evaluation results due to variation in quality evaluation environment and enables photosensitive compositions produced in different lots but including the same materials to be more accurately evaluated.

In the method for inspecting a photosensitive composition, exposure treatment, heat treatment, and development treatment are performed in this order to form a pattern. The dimension of the formed pattern is obtained, and the photosensitive composition is inspected using the dimension of the pattern. Hereinafter, the method for inspecting a photosensitive composition will be specifically described.

First Example of Method for Inspecting Photosensitive Composition

Figure 2:
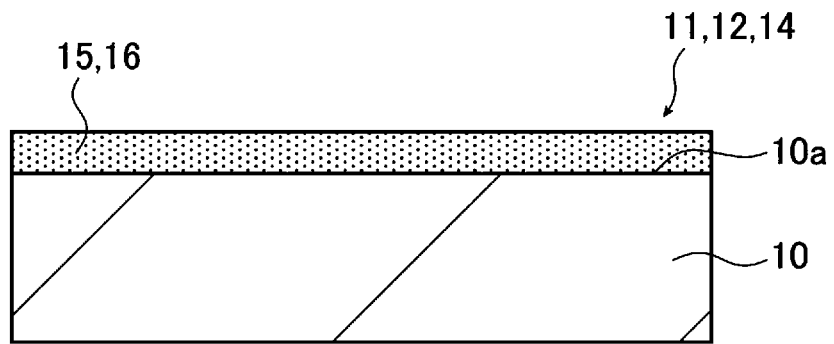
FIG. 2 is a schematic sectional view showing one step of the method for inspecting a photosensitive composition according to an embodiment of the present invention.
Figure 3:
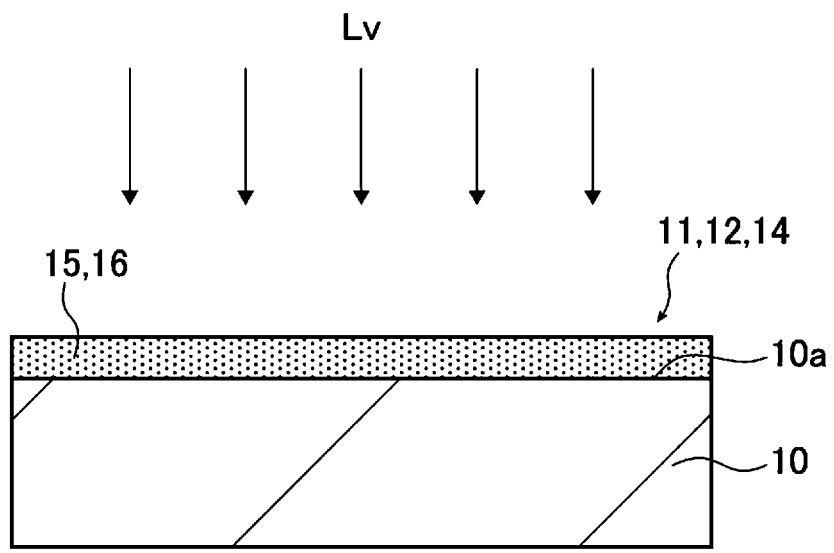
FIG. 3 is a schematic sectional view showing one step of the method for inspecting a photosensitive composition according to an embodiment of the present invention.
Figure 4:
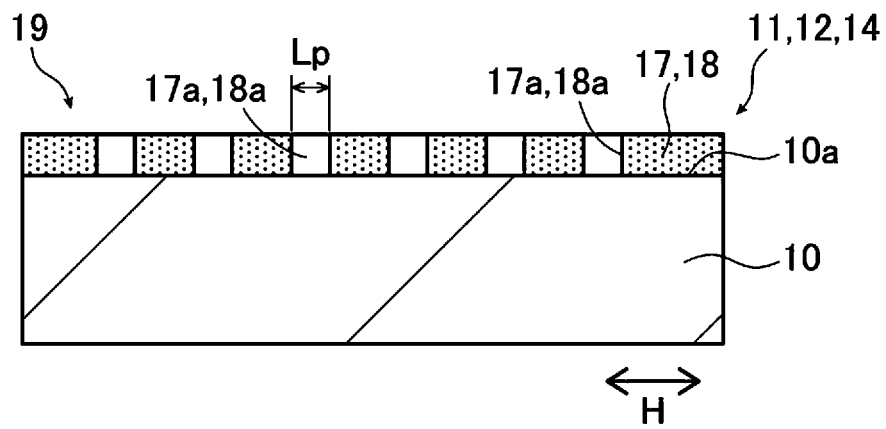
FIG. 4 is a schematic sectional view showing one step of the method for inspecting a photosensitive composition according to an embodiment of the present invention.

FIG. 1 is a flowchart showing a first example of the method for inspecting a photosensitive composition according to an embodiment of the present invention. FIG. 2 to FIG. 4 are schematic sectional views showing the method for inspecting a photosensitive composition according to an embodiment of the present invention in the order of steps.

In the first example of the method for inspecting a photosensitive composition, exposure treatment, heat treatment, and development treatment are first performed in this order on a dummy substrate including a first photosensitive composition layer formed using a first photosensitive composition (first step, Step S10). Through the first step (Step S10), the dummy substrate having a pattern is obtained.

Prior to the first step (Step S10), a first photosensitive composition layer 15 is first formed on a surface 10a of one support substrate 10 by using a first photosensitive composition, as shown in FIG. 2. Thus, a dummy substrate 11 including the first photosensitive composition layer 15 is obtained. For the formation of the first photosensitive composition layer 15, for example, but not exclusively, a spin coater is used.

The process then proceeds to the first step (Step S10). In the first step (Step S10), the dummy substrate 11 including the first photosensitive composition layer 15 is then subjected to exposure treatment such that the first photosensitive composition layer 15 is exposed to exposure light Lv as shown in FIG. 3. In the exposure treatment, for example, pattern exposure is performed, whereby a latent image based on the exposure pattern is formed. In the pattern exposure, for example, pattern exposure is individually performed on regions (not illustrated) corresponding one-to-one to a plurality of chips. The number of chips is appropriately determined according to the size of each region and the size of the dummy substrate, and is, for example, more than 50.

The exposure treatment is performed with a preset exposure amount and exposure time. The wavelength of the exposure light Lv is appropriately set according to the composition of the first photosensitive composition layer 15.

After the exposure treatment, heat treatment is performed. The heat treatment is, for example, post-exposure bake (PEB). In the heat treatment, a heating temperature and a heating time are appropriately set according to the composition of the first photosensitive composition layer 15.

After the heat treatment, development treatment is performed. In the development treatment, a developer corresponding to the composition of the first photosensitive composition layer 15 is used, and development is performed for a predetermined development time. As a result, an opening 17a is formed in a first resin composition layer 17 as shown in FIG. 4. The first resin composition layer 17 is formed as a result of the exposure of the first photosensitive composition layer 15. The first resin composition layer 17 having the opening 17a is a pattern 19. The pattern 19 is obtained by performing the exposure treatment and the development treatment on the first photosensitive composition layer 15. Thus, the dummy substrate 11 having the pattern 19 is obtained.

Here, the dimension of the pattern 19 is, for example, a length Lp of the opening 17a in the first resin composition layer 17 along a direction H parallel to the surface 10a of the support substrate 10. In the dummy substrate 11, the dimension of the pattern 19 is not measured.

When the first photosensitive composition layer 15 is positive, the exposed portion disappears upon development. When the first photosensitive composition layer 15 is negative, the exposed portion remains after development.

After the development treatment, rinsing treatment is performed, if necessary. For the rinsing treatment, for example, pure water is used. After the rinsing treatment, drying is performed. For the drying, for example, rotary drying is used.

Examples of the pattern formed by the above-described exposure treatment, heat treatment, and development treatment include, but are not limited to, resist patterns such as isolated patterns, dense patterns, and line-and-space patterns.

When the photosensitive composition is positive, a blank pattern formed as a result of disappearance of an exposed portion upon development, such as a hole or a trench, is preferred because such a pattern exhibits a low optical contrast and is susceptible to environmental variation.

When the photosensitive composition is negative, a remaining pattern formed of an exposed portion remaining after development, such as a dot or a line, is preferred because such a pattern exhibits a low optical contrast and is susceptible to environmental variation.

By using such a pattern susceptible to environmental variation, photosensitive compositions that are compositions including the same materials and produced in different lots can be more accurately evaluated.

Next, exposure treatment, heat treatment, and development treatment under the same conditions as in the first step are performed on a first evaluation substrate including the first photosensitive composition layer to form a pattern (second step, Step S12). Through the second step (Step S12), the first evaluation substrate having the pattern is obtained.

The second step (Step S12) is different from the first step (Step S10) described above in that the first evaluation substrate is used instead of the dummy substrate 11. In addition, the dimension of the pattern is measured in the second step (Step S12).

Prior to the second step (Step S12), a first photosensitive composition layer 15 is first formed on a surface 10a of one support substrate 10 by using the first photosensitive composition, as shown in FIG. 2. Thus, a first evaluation substrate 12 including the first photosensitive composition layer 15 is obtained. For the formation of the first photosensitive composition layer 15, for example, but not exclusively, a spin coater is used.

The process then proceeds to the second step (Step S12). In the second step (Step S12), the first evaluation substrate 12 including the first photosensitive composition layer 15 is then subjected to exposure treatment such that the first photosensitive composition layer 15 is exposed to exposure light Lv as shown in FIG. 3. In the exposure treatment, for example, pattern exposure is performed under the same conditions as in the first step, whereby a latent image based on the exposure pattern is formed.

The exposure treatment is performed with an exposure amount and exposure time under the same conditions as in the first step. The wavelength of the exposure light Lv is set under the same conditions as in the first step.

After the exposure treatment, heat treatment is performed. The heat treatment is, for example, post-exposure bake (PEB). In the heat treatment, a heating temperature and a heating time under the same conditions as in the first step are set.

After the heat treatment, development treatment is performed. In the development treatment, the same developer as in the first step is used, and development is performed for a development time under the same conditions as in the first step. As a result, an opening 17a is formed in a first resin composition layer 17 to obtain a pattern 19, as shown in FIG. 4. Thus, the first evaluation substrate 12 having the pattern 19 is obtained. The dimension of the pattern 19 of the first evaluation substrate 12 is measured.

After the development treatment, rinsing treatment is performed, if necessary. For the rinsing treatment, for example, pure water is used. After the rinsing treatment, drying is performed. For the drying, for example, rotary drying is used.

The dimension of the pattern 19 of the first evaluation substrate 12 is, for example, in the case of a trench or a line, a length Lp of the opening 17a in the first resin composition layer 17 along a direction H parallel to the surface 10a of the support substrate 10.

The length Lp of the opening 17a of the first resin composition layer 17 is determined as follows: for example, for about 50 regions among regions (not illustrated) corresponding one-to-one to a plurality of chips, the distance corresponding to the length Lp of the opening 17a of the first resin composition layer 17 in each region is measured at about 1 to 7 points using a scanning electron microscope, and the average of the measured values is calculated to determine the length Lp.

The dimension of the pattern 19 of the first evaluation substrate 12 is, for example, in the case of a hole or a dot, the length in the diameter direction of the hole or the dot.

Next, exposure treatment, heat treatment, and development treatment under the same conditions as in the first step are performed on a second evaluation substrate including a second photosensitive composition layer formed using a second photosensitive composition to form a pattern (third step, Step S14). Through the third step (Step S14), the second evaluation substrate having the pattern is obtained.

The third step (Step S14) is different from the second step (Step S12) in that the second photosensitive composition and the second evaluation substrate are used. Also for the second evaluation substrate, the dimension of the pattern is measured.

Prior to the third step (Step S14), a second photosensitive composition layer 16 is first formed on a surface 10a of one support substrate 10 by using the second photosensitive composition, as shown in FIG. 2. A second evaluation substrate 14 including the second photosensitive composition layer 16 is obtained. For the formation of the second photosensitive composition layer 16, for example, but not exclusively, a spin coater is used.

The process then proceeds to the third step (Step S14). In the third step (Step S14), the second evaluation substrate 14 including the second photosensitive composition layer 16 is then subjected to exposure treatment such that the second photosensitive composition layer 16 is exposed to exposure light Lv as shown in FIG. 3. In the exposure treatment, for example, pattern exposure is performed under the same conditions as in the first step, whereby a latent image based on the exposure pattern is formed.

The exposure treatment is performed with an exposure amount and exposure time under the same conditions as in the first step. The wavelength of the exposure light Lv is set under the same conditions as in the first step.

After the exposure treatment, heat treatment is performed. The heat treatment is, for example, post-exposure bake (PEB). In the heat treatment, a heating temperature and a heating time under the same conditions as in the first step are set.

After the heat treatment, development treatment is performed. In the development treatment, the same developer as in the first step is used, and development is performed for a development time under the same conditions as in the first step. As a result, an opening 18a is formed in a second resin composition layer 18 as shown in FIG. 4. The second resin composition layer 18 is formed as a result of the exposure of the second photosensitive composition layer 16. The second resin composition layer 18 having the opening 18a is a pattern 19. The pattern 19 is obtained by performing the exposure treatment and the development treatment on the second photosensitive composition layer 16. Thus, the second evaluation substrate 14 having the pattern 19 is obtained. The dimension of the pattern 19 of the second evaluation substrate 14 is measured.

When the second photosensitive composition layer 16 is positive, the exposed portion disappears upon development. When the second photosensitive composition layer 16 is negative, the exposed portion remains after development.

After the development treatment, rinsing treatment is performed, if necessary. For the rinsing treatment, for example, pure water is used. After the rinsing treatment, drying is performed. For the drying, for example, rotary drying is used.

As with the dimension of the pattern 19 of the first evaluation substrate 12 described above, the dimension of the pattern 19 of the second evaluation substrate 14 is, for example, in the case of a trench or a line, a length Lp of the opening 18a in the second resin composition layer 18 along a direction H parallel to the surface 10a of the support substrate 10.

As in the case of the first evaluation substrate 12, the length Lp of the opening 18a of the second resin composition layer 18 is determined as follows: for example, for about 50 regions among regions (not illustrated) corresponding one-to-one to a plurality of chips, the distance corresponding to the length Lp of the opening 18a of the second resin composition layer 18 in each region is measured at about 1 to 7 points using a scanning electron microscope, and the average of the measured values is calculated to determine the length Lp.

The dimension of the pattern 19 of the second evaluation substrate 14, as with that of the first evaluation substrate 12, is, for example, in the case of a hole or a dot, the length in the diameter direction of the hole or the dot.

Next, it is determined whether the difference between the dimension of the pattern obtained in the second step (Step S12) and the dimension of the pattern obtained in the third step (Step S14) is within an acceptable range (fourth step, Step S16).

The photosensitive composition for forming the first photosensitive composition layer and the photosensitive composition for forming the second photosensitive composition layer described above are compositions including the same materials and produced in different lots. The photosensitive composition for forming the first photosensitive composition layer and the photosensitive composition for forming the second photosensitive composition layer have the same composition but are produced at different times.

When compositions include the same materials, it means that they are produced according to the same recipe. Being produced in different lots means being produced at different times and also includes being produced with different apparatuses.

In the fourth step (Step S16), for example, when the difference between the dimension of the pattern obtained in the second step (Step S12) and the dimension of the pattern obtained in the third step (Step S14) is within the acceptable range, it is determined that there is no difference in performance between the photosensitive composition for forming the first photosensitive composition layer and the photosensitive composition for forming the second photosensitive composition layer. When the difference is beyond the acceptable range, it is determined that there is a difference in performance between the photosensitive composition for forming the first photosensitive composition layer and the photosensitive composition for forming the second photosensitive composition layer.

The acceptable range of the difference between the dimensions of the patterns is not particularly limited and may be a target value of the difference between the dimensions of the patterns. It may also be a ratio between the dimensions of the patterns.

For example, the acceptable range of the difference between the dimensions of the patterns is preferably ±35.0 nm or less, more preferably ±10.0 nm or less, even more preferably ±1.0 nm or less, still more preferably ±0.7 nm or less.

As the support substrates used for the dummy substrate, the first evaluation substrate, and the second evaluation substrate, substrates used to produce semiconductor devices are used. Since the dummy substrate, the first evaluation substrate, and the second evaluation substrate are used to inspect a photosensitive composition, support substrates having the same size and composition are used. The support substrates having the same size and composition are, for example, silicon substrates having the same size and purity. The support substrates used for the dummy substrate, the first evaluation substrate, and the second evaluation substrate are not particularly limited as long as they have the same size and composition, and various semiconductor substrates can be used in addition to the silicon substrates as described below.

Second Example of Method for Inspecting Photosensitive Composition

Figure 5:
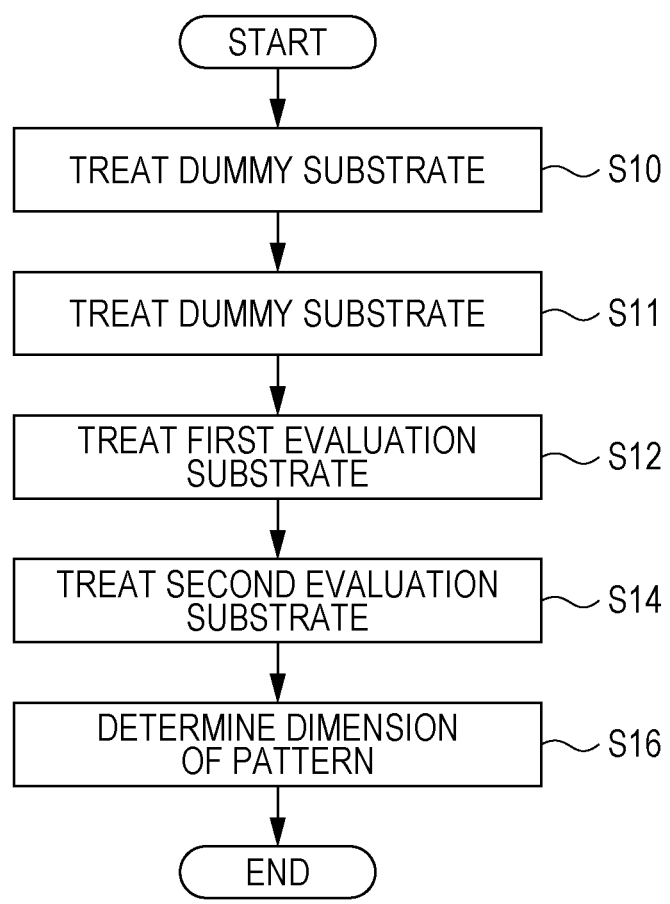
FIG. 5 is a flowchart showing a second example of the method for inspecting a photosensitive composition according to an embodiment of the present invention.

FIG. 5 is a flowchart showing a second example of the method for inspecting a photosensitive composition according to an embodiment of the present invention. In the second example of the method for inspecting a photosensitive composition, the same steps as in the above-described first example of the method for inspecting a photosensitive composition will not be elaborated here.

The second example of the method for inspecting a photosensitive composition is different from the first example of the method for inspecting a photosensitive composition in that a dummy substrate is treated a plurality of times, and the other steps are the same as those in the first example of the method for inspecting a photosensitive composition.

In the second example of the method for inspecting a photosensitive composition, after a dummy substrate having a pattern is obtained in the first step (Step S10), exposure treatment, heat treatment, and development treatment under the same conditions as in the first step are performed in this order again on the dummy substrate including a first photosensitive composition layer formed using a first photosensitive composition (Step S11). Through Step S11, as with the first step (Step S10), the dummy substrate having a pattern is obtained.

In the second example of the method for inspecting a photosensitive composition, after Step S11, the second step (Step S12), the third step (Step S14), and a fourth step (Step S16) are performed.

The second example of the method for inspecting a photosensitive composition is an inspection method in which the first step (Step S10) is performed a plurality of times. By performing the first step (Step S10) a plurality of times, the environment for evaluating the quality of a photosensitive composition can be stabilized.

When the first step (Step S10) is performed a plurality of times, it is preferably, but not necessarily, performed twice from the viewpoint of suppressing an increase in the time required for the inspection method.

Third Example of Method for Inspecting Photosensitive Composition

Figure 6:
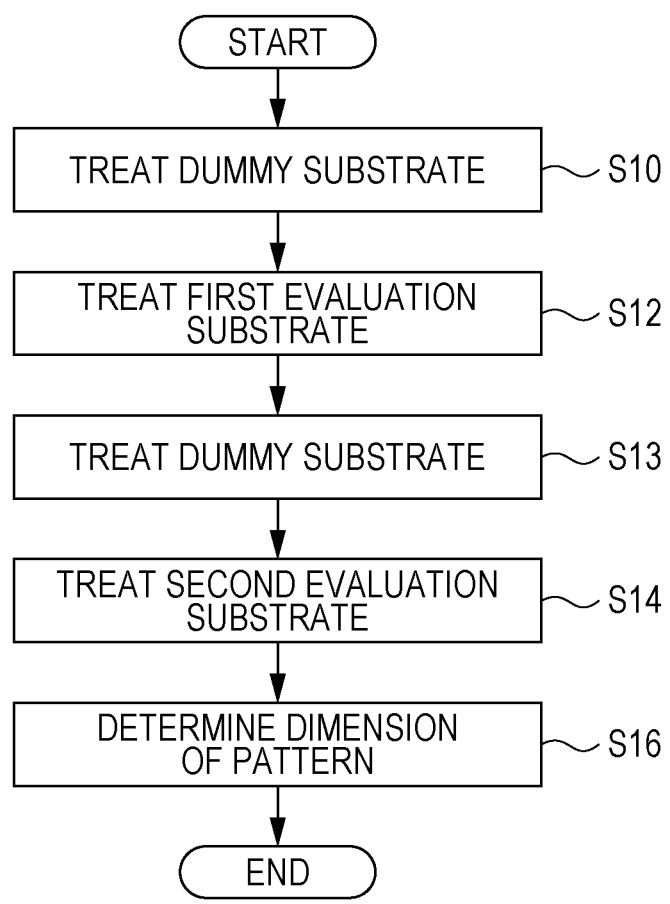
FIG. 6 is a flowchart showing a third example of the method for inspecting a photosensitive composition according to an embodiment of the present invention.

FIG. 6 is a flowchart showing a third example of the method for inspecting a photosensitive composition according to an embodiment of the present invention. In the third example of the method for inspecting a photosensitive composition, the same steps as in the above-described first example of the method for inspecting a photosensitive composition will not be elaborated here.

The third example of the method for inspecting a photosensitive composition is different from the first example of the method for inspecting a photosensitive composition in that the third example has, between the second step (Step S12) and the third step (Step S14), a fifth step (Step S13) of performing exposure treatment, heat treatment, and development treatment in this order on a dummy substrate including a second photosensitive composition layer formed using a second photosensitive composition, and other steps are the same as those in the first example of the method for inspecting a photosensitive composition.

In the third example of the method for inspecting a photosensitive composition, the dummy substrate having a pattern is obtained through the fifth step (Step S13).

By producing the dummy substrate including the second photosensitive composition layer in the fifth step (Step S13) before the third step (Step S14), the environment for evaluating the quality of a photosensitive composition can be stabilized, and the dimension of the pattern of the second evaluation substrate including the second photosensitive composition layer in the third step (Step S14) can be less susceptible to the pattern formation environment. This enables photosensitive compositions including the same materials to be more accurately evaluated.

Prior to the fifth step (Step S13), a second photosensitive composition layer 16 is first formed on a surface 10a of a support substrate 10 by using the second photosensitive composition, as shown in FIG. 2. A dummy substrate 11 including the second photosensitive composition layer 16 is obtained. For the formation of the second photosensitive composition layer 16, for example, but not exclusively, a spin coater is used.

The process then proceeds to the fifth step (Step S13). In the fifth step (Step S13), the dummy substrate 11 including the second photosensitive composition layer 16 is then subjected to exposure treatment such that the second photosensitive composition layer 16 is exposed to exposure light Lv as shown in FIG. 3. In the exposure treatment, for example, pattern exposure is performed under the same conditions as in the first step, whereby a latent image based on the exposure pattern is formed.

The exposure treatment is performed with an exposure amount and exposure time under the same conditions as in the first step. The wavelength of the exposure light Lv is set under the same conditions as in the first step.

After the exposure treatment, heat treatment is performed. The heat treatment is, for example, post-exposure bake (PEB). In the heat treatment, a heating temperature and a heating time under the same conditions as in the first step are set.

After the heat treatment, development treatment is performed. In the development treatment, the same developer as in the first step is used, and development is performed for a development time under the same conditions as in the first step. As a result, an opening 18a is formed in a second resin composition layer 18 to obtain a pattern 19, as shown in FIG. 4. Thus, the dummy substrate 11 having the pattern 19 is obtained.

After the development treatment, rinsing treatment is performed, if necessary. For the rinsing treatment, for example, pure water is used. After the rinsing treatment, drying is performed. For the drying, for example, rotary drying is used.

The fifth step (Step S13) may be performed a plurality of times as with the first step (Step S10) described above. By performing the fifth step (Step S13) a plurality of times, the environment for evaluating the quality of a photosensitive composition can be stabilized.

When the fifth step (Step S13) is performed a plurality of times, it is preferably, but not necessarily, performed twice from the viewpoint of suppressing an increase in the time required for the inspection method.

Fourth Example of Method for Inspecting Photosensitive Composition

Figure 7:
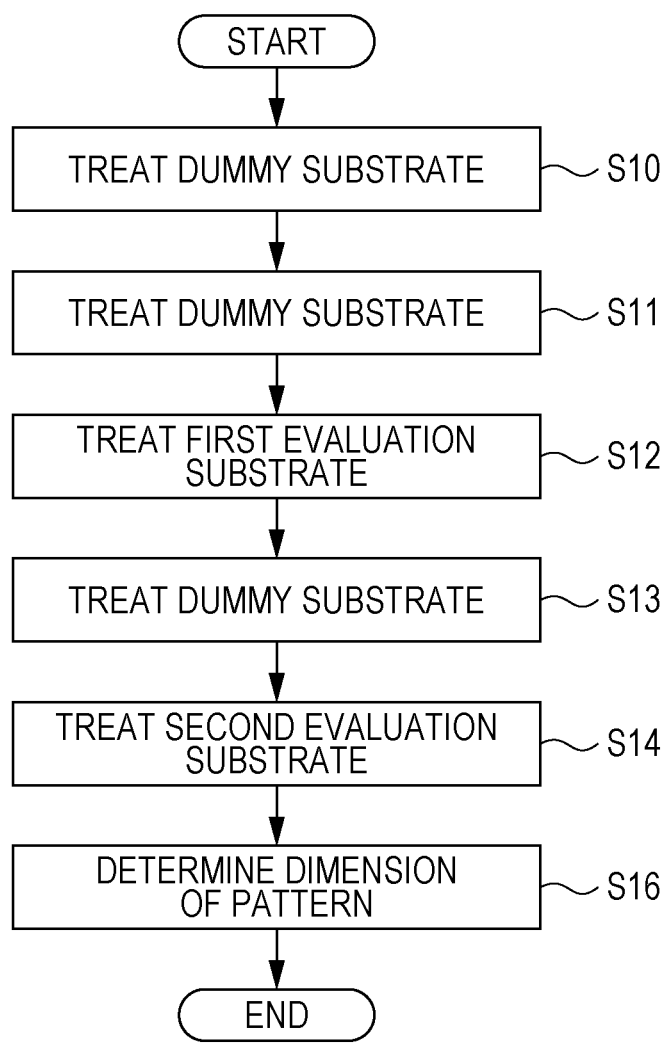
FIG. 7 is a flowchart showing a fourth example of the method for inspecting a photosensitive composition according to an embodiment of the present invention.

FIG. 7 is a flowchart showing a fourth example of the method for inspecting a photosensitive composition according to an embodiment of the present invention. In the fourth example of the method for inspecting a photosensitive composition, the same steps as in the above-described third example of the method for inspecting a photosensitive composition will not be elaborated here.

The fourth example of the method for inspecting a photosensitive composition is different from the third example of the method for inspecting a photosensitive composition in that a dummy substrate is treated a plurality of times, and the other steps are the same as those in the third example of the method for inspecting a photosensitive composition. That is, the fourth example of the method for inspecting a photosensitive composition has Step S11 described above.

In the fourth example of the method for inspecting a photosensitive composition, after a dummy substrate having a pattern is obtained in the first step (Step S10), exposure treatment, heat treatment, and development treatment under the same conditions as in the first step are performed in this order again on the dummy substrate including a first photosensitive composition layer formed using a first photosensitive composition (Step S11). Through Step S11, as with the first step (Step S10), the dummy substrate having a pattern is obtained.

The fourth example of the method for inspecting a photosensitive composition is an inspection method in which the first step (Step S10) is performed a plurality of times. By performing the first step (Step S10) a plurality of times, the environment for evaluating the quality of a photosensitive composition can be stabilized.

In the third example of the method for inspecting a photosensitive composition and the fourth example of the method for inspecting a photosensitive composition, the fifth step (Step S13) may be repeated a plurality of times between the second step (Step S12) and the third step (Step S14). This can stabilize the environment for evaluating the quality of a photosensitive composition, and the dimension of the pattern of the second evaluation substrate including the second photosensitive composition layer in the third step (Step S14) can be less susceptible to the pattern formation environment.

The time period between the second step (Step S12) and the third step (Step S14) is preferably 8 minutes or more. When the time period between the second step (Step S12) and the third step (Step S14) is 8 minutes or more, the influence of a previous substrate can be advantageously cancelled.

Here, the start time of the time period between the second step (Step S12) and the third step (Step S14) is defined as the point in time when the first evaluation substrate comes out of an apparatus such as an exposure unit after the exposure treatment in the second step (Step S12) (the point in time when the entire first evaluation substrate comes out). The elapsed time from the start time is the time period between the second step (Step S12) and the third step (Step S14).

The time period between the second step (Step S12) and the third step (Step S14) is more preferably up to 10 minutes. When this time period is about 10 minutes, an increase in the total time spent on substrate production can be advantageously suppressed.

The time period between the second step (Step S12) and the third step (Step S14) is measured with a timepiece.

When the dummy substrate in Step S13 (fifth step) described above is treated between the second step (Step S12) and the third step (Step S14), the time period between the second step (Step S12) and the third step (Step S14) also includes the time for treatment of the dummy substrate in Step S13 (fifth step) described above.

When the fifth step is carried out between the second step and the third step as described above, the time period (minutes) between the second step and the third step may be 8 minutes or less, and the second step, the fifth step, and the third step are preferably performed as continuous treatment. In the case of continuous treatment, the time period (minutes) between the second step and the third step is, for example, 1 to 10 minutes.

In the second step, the third step, and the fifth step, exposure treatment, heat treatment, and development treatment are performed under the same conditions as in the first step. The phrase "under the same conditions as in the first step" means that the same set conditions are used in exposure treatment, heat treatment, and development treatment in the first step, the second step, the third step, and the fifth step. In the exposure treatment, for example, the same exposure amount and the same exposure time are used. In the heat treatment, the same heating temperature and the same heating time are used. In the development treatment, the same developer, the same developing time, the same rinsing solution, the same rinsing time, and the same drying method are used.

While it has been described that exposure treatment, heat treatment, and development treatment are performed in this order, treatments other than the above-described treatments may be performed. For example, a known treatment for forming a pattern on a photosensitive composition layer may be performed.

For example, after the formation of the first photosensitive composition layer 15 and the second photosensitive composition layer 16 and before the exposure treatment, pre-bake is performed on the first photosensitive composition layer 15 and the second photosensitive composition layer 16. In this case, the conditions of the pre-bake, such as maximum pre-baking temperature and treatment time, are set to be the same conditions. After the development treatment of the first photosensitive composition layer 15 and the second photosensitive composition layer 16, post-bake is performed on the first resin composition layer 17 and the second resin composition layer 18. In this case, the conditions of the post-bake, such as maximum post-baking temperature and treatment time, are set to be the same conditions.

The phrase "under the same conditions as in the first step" also includes performing, in the first step, the second step, the third step, and the fifth step, the above-described exposure treatment, heat treatment, and development treatment by using the same apparatuses as described below with the conditions of each apparatus set to be the same, and further includes performing the above-described pre-bake and post-bake by using the same apparatuses with the conditions of each apparatus set to be the same.

Treatment Device Group

Figure 8:
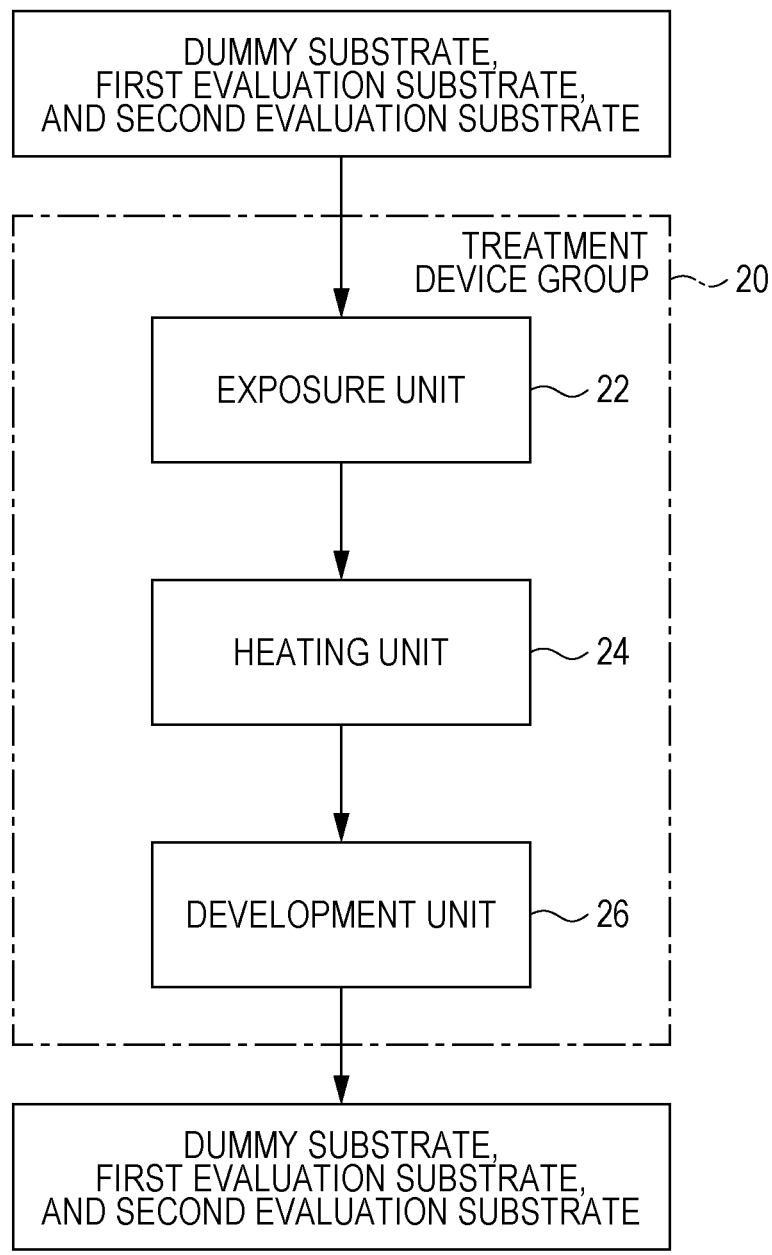
FIG. 8 is a schematic view conceptually showing an example of a treatment device group used in the method for inspecting a photosensitive composition according to an embodiment of the present invention.

FIG. 8 is a schematic view conceptually showing an example of a treatment device group used in the method for inspecting a photosensitive composition according to an embodiment of the present invention.

In the above-described method for inspecting a photosensitive composition, for example, exposure treatment, heat treatment, and development treatment can be performed with a treatment device group 20 shown in FIG. 8. The treatment device group 20 has an exposure unit 22, a heating unit 24, and a development unit 26.

The treatment device group 20 has, for example, an import and export device (not shown) for importing and exporting a dummy substrate, a first evaluation substrate, and a second evaluation substrate into and out of the exposure unit 22, the heating unit 24, and the development unit 26, and a standby section (not shown) where these substrates stand by.

The arrangement of the units of the treatment device group 20 is not particularly limited, and the exposure unit 22, the heating unit 24, and the development unit 26 may be arranged adjacent to each other or may be arranged apart from each other. When the exposure unit 22, the heating unit 24, and the development unit 26 are arranged apart from each other, for example, an automatic transport device (not shown) that transports a dummy substrate, a first evaluation substrate, and a second evaluation substrate to the exposure unit 22, the heating unit 24, and the development unit 26 may be provided.

Inside the exposure unit 22, a first photosensitive composition layer formed using a first photosensitive composition or a second photosensitive composition layer formed using a second photosensitive composition is subjected to, for example, pattern exposure. The configuration of the exposure unit 22 is not particularly limited, and a configuration used for exposure of a resist film in a semiconductor manufacturing apparatus can be appropriately used.

Inside the heating unit 24, the first photosensitive composition layer or second photosensitive composition layer subjected to pattern exposure is subjected to post-exposure bake (PEB). The heat treatment in the heating unit 24 is post-exposure bake (PEB). The configuration of the heating unit 24 is not particularly limited, and a configuration used for post-exposure bake of a resist film subjected to pattern exposure in a semiconductor manufacturing apparatus can be appropriately used.

Inside the development unit 26, the first photosensitive composition layer or second photosensitive composition layer subjected to pattern exposure is brought into contact with a developer to dissolve and remove pattern-exposed portions or unexposed regions. The configuration of the development unit 26 is not particularly limited, and a configuration used for development of a resist film subjected to pattern exposure in a semiconductor manufacturing apparatus can be appropriately used. The development unit 26 may also have a function to perform rinsing treatment.

When the treatment device group 20 is used, in the above-described method for inspecting a photosensitive composition, for example, the first step is a step of exposing a dummy substrate including a first photosensitive composition layer in the exposure unit 22, heating the exposed dummy substrate in the heating unit 24, and developing the heated dummy substrate in the developing unit 26.

For example, the second step is a step of exposing the first evaluation substrate including the first photosensitive composition layer in the exposure unit 22 under the same conditions as in the first step, heating the exposed first evaluation substrate in the heating unit 24 under the same conditions as in the first step, and developing the heated first evaluation substrate in the developing unit 26 under the same conditions as in the first step to form a pattern.

For example, the third step is a step of exposing the second evaluation substrate including the second photosensitive composition layer formed using the second photosensitive composition in the exposure unit 22 under the same conditions as in the first step, heating the exposed second evaluation substrate in the heating unit 24 under the same conditions as in the first step, and developing the heated second evaluation substrate in the developing unit 26 under the same conditions as in the first step to form a pattern.

For example, the fifth step is a step of exposing the dummy substrate including the second photosensitive composition layer in the exposure unit 22, heating the exposed dummy substrate in the heating unit 24, and developing the heated dummy substrate in the developing unit 26.

As described above, pre-bake may be performed on the first photosensitive composition layer 15 and the second photosensitive composition layer 16 after the formation of the first photosensitive composition layer 15 and the second photosensitive composition layer 16 and before the exposure treatment, and post-bake may be performed on the first resin composition layer 17 and the second resin composition layer 18 after the development treatment. Therefore, the treatment device group 20 may have, upstream the exposure unit 22, a heat treatment unit that performs pre-bake. The treatment device group 20 may have, downstream the development unit 26, a heat treatment unit that performs post-bake. In this case, also in the heat treatment unit that performs pre-bake and the heat treatment unit that performs post-bake, the dummy substrate, the first evaluation substrate, and the second evaluation substrate are subjected to the pre-bake and the post-bake under the same conditions, as described above.

The treatment device group 20 may have a spin coater for applying a photosensitive composition, or may have a coater developer that also serves as the exposure unit 22.

In the first step, as described above, it is preferable to treat one dummy substrate in the exposure unit 22, the heating unit 24, and the development unit 26.

In the second step, as described above, it is preferable to treat one first evaluation substrate in the exposure unit 22, the heating unit 24, and the development unit 26.

In the third step, as described above, it is preferable to treat one second evaluation substrate in the exposure unit 22, the heating unit 24, and the development unit 26.

In the fifth step, as described above, it is preferable to treat one dummy substrate in the exposure unit 22, the heating unit 24, and the development unit 26.

Treating one substrate at a time in each of the first step, the second step, the third step, and the fifth step as described above provides an advantage in that variation in measured values of patterns obtained using photosensitive compositions that are compositions including the same materials and produced in different lots can be further reduced. That is, it is advantageous in that photosensitive compositions that are compositions including the same materials and produced in different lots can be more accurately evaluated.

The exposure unit 22, the heating unit 24, and the development unit 26 need not necessarily be configured to treat one substrate at a time, and can treat any number of substrates according to the configuration of the units, for example, two substrates at a time.

Method for Producing Photosensitive Composition

The above-described method for inspecting a photosensitive composition can be utilized for the method for producing a photosensitive composition. The results of the inspection method using a dummy substrate as described above are utilized in the method for producing a photosensitive composition. The method for producing a photosensitive composition includes the method for inspecting a photosensitive composition.

For example, in the method for producing a photosensitive composition, an acceptable range of the difference between dimensions of patterns is set in advance. For a photosensitive composition produced, the difference between dimensions of patterns is measured using the photosensitive composition according to the above-described method for inspecting a photosensitive composition. The measured difference between dimensions of patterns and the acceptable range are compared with each other, and, for example, if the difference between dimensions of patterns is within the acceptable range, the photosensitive composition is judged as acceptable and used as a photosensitive composition. If the difference between dimensions of patterns is beyond the acceptable range, the photosensitive composition is judged as unacceptable and not used as a photosensitive composition.

In the above description, the comparison and the determination are carried out, for example, in such a manner that various numerical values are entered into a computer, compared with an acceptable range or the like, and determined based on the acceptable range or the like. Thus, the comparison and the determination are performed, for example, by a computer.

Dummy Substrate, First Evaluation Substrate, and Second Evaluation Substrate

The support substrates used for the dummy substrate, the first evaluation substrate, and the second evaluation substrate are substrates having the same size and composition. The substrates having the same size and composition are, for example, silicon substrates as described above. The support substrates used for the dummy substrate, the first evaluation substrate, and the second evaluation substrate are not particularly limited to silicon substrates as long as they have the same size and composition. In addition to silicon substrates, various semiconductor substrate such as sapphire substrates, SiC substrates, GaP substrates, GaAs substrates, InP substrates, and GaN substrates can be used.

The dummy substrate is subjected to exposure treatment, heat treatment, and development treatment as described above but is not subjected to measurement of pattern dimension. By contrast, the first evaluation substrate and the second evaluation substrate are subjected to measurement of pattern dimension.

The present invention is basically configured as described above. While the method for inspecting a photosensitive composition and the method for producing a photosensitive composition according to the present invention have been described above in detail, the present invention is not limited to the embodiments described above, and as a matter of course, various modifications or changes may be made without departing from the spirit of the present invention.

Photosensitive Composition

The type of the photosensitive composition (the first photosensitive composition and the second photosensitive composition) is not particularly limited, and a known photosensitive composition can be used.

For example, as the photosensitive composition, a resin (hereinafter also referred to simply as an "acid decomposable resin") having a group (hereinafter also referred to simply as an "acid decomposable group") that generates a polar group under the action of acid, a photoacid generator, or a photosensitive composition including a solvent can be used.

The acid decomposable group preferably has a structure in which a polar group is protected by a leaving group that leaves under the action of acid. That is, the acid decomposable resin has a repeating unit having an acid decomposable group. The resin having such a repeating unit becomes more polar under the action of acid to experience an increase in solubility in alkali developers and a decrease in solubility in organic solvents.

The polar group is preferably an alkali-soluble group, and examples thereof include acidic groups such as a carboxyl group, a phenolic hydroxyl group, a fluorinated alcohol group, a sulfonic group, a phosphate group, a sulfonamide group, a sulfonylimide group, an (alkylsulfonyl)(alkylcarbonyl) methylene group, an (alkylsulfonyl)(alkylcarbonyl) imide group, a bis(alkylcarbonyl) methylene group, a bis(alkylcarbonyl) imide group, a bis(alkylsulfonyl) methylene group, a bis(alkylsulfonyl) imide group, a tris(alkylcarbonyl) methylene group, and a tris(alkylsulfonyl) methylene group, and alcoholic hydroxyl groups.

The acid decomposable resin may include a repeating unit other than the repeating unit having an acid decomposable group (e.g., a repeating unit having an acid group, a repeating unit having a lactone group, a sultone group, or a carbonate group, or a repeating unit having a fluorine atom or an iodine atom).

As the acid decomposable resin, a known acid decomposable resin can be used.

The photoacid generator is not particularly limited as long as it is a known photoacid generator, but is preferably a compound that generates at least one of an organic acid such as sulfonic acid, bis(alkylsulfonyl) imide, or tris(alkylsulfonyl) methide upon irradiation with actinic rays or radioactive rays, preferably electron rays or extreme ultraviolet rays.

Examples of the solvent include water and organic solvents. The type of the organic solvent is not particularly limited, and examples include alcohol solvents, ether solvents, ester solvents, ketone solvents, and hydrocarbon solvents.

The above photosensitive composition may include materials other than the acid decomposable resin, the photoacid generator, and the solvent.

For example, the photosensitive composition may include an acid diffusion control agent. Examples of the acid diffusion control agent include basic compounds and compounds that have proton-accepting functional groups and decompose upon irradiation with actinic rays or radioactive rays to generate compounds whose proton-accepting properties are reduced, lost, or changed to acidic properties.

The photosensitive composition may also include a compound selected from the group consisting of hydrophobic resins, surfactants, dissolution-inhibiting compounds, dyes, plasticizers, photosensitizers, light absorbents, and compounds that promote solubility in developers.

Examples of the photosensitive composition including an acid decomposable resin and the like include a photosensitive composition disclosed in WO2021/070590A, the contents of which are incorporated herein by reference.

The photosensitive composition may be a photosensitive composition including a cross-linking agent having a cross-linking group, a compound having a reactive group that reacts with the cross-linking group, and a solvent.

The combination of the cross-linking group and the reactive group is not particularly limited, and a known combination is employed.

The cross-linking group or the reactive group may be protected by a protecting group. For example, the photosensitive composition may further include a photoacid generator so that the protecting group is eliminated by an acid generated by the photoacid generator. Alternatively, a cross-linked structure may be formed as a result of a condensation reaction between the cross-linking agent and the resin caused by the acid generated by the photoacid generator.

While the photosensitive composition has been described in the context of including two compounds: a cross-linking agent having a cross-linking group and compound having a reactive group that reacts with the cross-linking group, one compound may include a cross-linking group and a reactive group.

The photosensitive composition may be a photosensitive composition including a main chain scission type polymer and a solvent.

When a polymer is of "main chain scission type", it means that the polymer has the property of undergoing scission of the main chain when irradiated with light such as ionizing radiation or ultraviolet light.

Examples of the main chain scission type polymer include acrylic main chain scission type resists such as polymethyl methacrylate (PMMA), ZEP (manufactured by Zeon Corporation), which is a copolymer of α-chloro methacrylate and α-methylstyrene, and poly-2,2,2-trifluoroethyl α-chloroacrylate (EBR-9, manufactured by Toray Industries, Inc.).

The photosensitive composition may be what is called a metal resist composition.

Examples of the metal resist composition include photosensitive compositions that can form a coating including a metal oxo-hydroxo network having an organic ligand through a metal carbon bond and/or a metal carboxylate bond.

Examples of the metal resist composition include composition disclosed in JP2019-113855A, the contents of which are incorporated herein by reference.

EXAMPLES

The present invention will now be described in more detail with reference to examples. The materials, amounts, proportions, treatments, treatment sequences, and other details given in the following examples may be changed as appropriate without departing from the spirit of the present invention. Thus, the scope of the present invention should not be construed as being limited by the examples given below.

Preparation of First Photosensitive Composition

A photosensitive composition was prepared by mixing components shown below.

| | |
|---|---|
| Resin (A-1 shown below) | 3.914 g |
| Acid generator (B-1 shown below) | 0.08 g |
| Basic compound (BS-1 shown below) | 0.004 g |
| Surfactant (H-1 shown below) | 0.002 g |
| Solvent (PGMEA) of solid contents | Added appropriately according to the concentration |

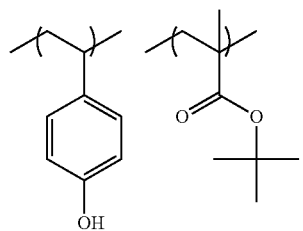

Resin A-1

Compositional ratio: 70/30, weight average molecular weight Mw: 23,000, dispersity (Mw/Mn): 1.51

Acid generator B-1: triphenylsulfonium perfluorobutane-1-sulfonate

Basic compound BS-1: dicyclohexylmethylamine

Surfactant H-1: Megafac F176 (manufactured by DIC Corporation)

Preparation of Second Photosensitive Composition

The same composition was prepared two weeks after "Preparation of first photosensitive composition" above.

Treatment of First Evaluation Substrate

A Si substrate (manufactured by GlobalWafers Japan Co., Ltd.) was used for the treatment of a first evaluation substrate.

The first photosensitive composition prepared so as to have a solid concentration of 19 mass % was filtered through a polyethylene filter having a pore size of 200 nm manufactured by Entegris Inc. and then further filtered through a polyethylene filter having a pore size of 50 nm manufactured by Entegris Inc. to obtain a photosensitive composition.

The photosensitive composition obtained was applied onto the Si substrate (manufactured by Global Wafers Japan Co., Ltd.) treated with hexamethyldisilazane, and pre-baked at 130° C. for 60 seconds to form a photosensitive composition layer having a thickness of 5 μm.

The Si substrate was subjected to pattern exposure through an exposure mask by using a KrF excimer laser scanner (manufactured by ASML, PAS5500/850C, wavelength: 248 nm, numerical aperture (NA): 0.80). The exposure mask had an isolated trench pattern with a trench width of 3 μm and a pitch of 33 μm. On the Si substrate, 100 regions corresponding one-to-one to 100 chips were subjected to pattern exposure.

The exposed Si substrate was post-baked at 120° C. for 60 seconds, then developed with a 2.38 mass % aqueous tetramethylammonium hydroxide solution (TMAHaq) for 60 seconds, rinsed with pure water, and then spin-dried. Thus, the Si substrate having the isolated trench pattern was obtained. The pattern was formed so as to have a trench width of 3 μm. The trench width of the isolated trench pattern obtained was determined as follows: the pattern was observed from the front side of the Si substrate, and for 50 regions among the 100 regions subjected to pattern exposure, the distance corresponding to the trench width of each region was measured at three points, that is, at 150 points in total, using a scanning electron microscope, and the average of the measured values was calculated to determine the trench width.

Treatment of Second Evaluation Substrate

The treatment of a second evaluation substrate was performed in the same manner as the treatment of the first evaluation substrate except using the second photosensitive composition prepared so as to have a solid concentration of 19 mass %, thereby forming an isolated trench pattern having a trench width of 3 μm and a pitch of 33 μm.

Treatment of Dummy Substrate 1

The treatment of a dummy substrate 1 was performed in the same manner as the treatment of the first evaluation substrate to form an isolated trench pattern having a trench width of 3 μm and a pitch of 33 μm. In the treatment of the dummy substrate 1, the trench width was not measured.

Treatment of Dummy Substrate 2

The treatment of a dummy substrate 2 was performed in the same manner as the treatment of the first evaluation substrate except using the second photosensitive composition prepared so as to have a solid concentration of 19 mass %, thereby forming an isolated trench pattern having a trench width of 3 μm and a pitch of 33 μm. In the treatment of the dummy substrate 2, the trench width was not measured.

The treatment of the first evaluation substrate, the treatment of the second evaluation substrate, the treatment of the dummy substrate 1, and the treatment of the dummy substrate 2 were each performed using an exposure unit, a heating unit, and a development unit.

The exposure unit was set to an exposure amount of 30 cmJ/cm$^2$ and an exposure time of 60 seconds.

The heating unit was set to perform post-exposure bake (PEB) at a heating temperature of 110° C. for 60 seconds.

In the development unit, a 2.38 mass % aqueous tetramethylammonium hydroxide solution was used as a developer. The development time was set to 60 seconds. Pure water was used as a rinsing solution, and the time of rinsing was set to 15 seconds. Spin drying was performed at 4,000 rpm (revolution per minute) for 10 seconds.

In each of the treatment of the first evaluation substrate, the treatment of the second evaluation substrate, the treatment of the dummy substrate 1, and the treatment of the dummy substrate 2, pre-bake was performed before exposure, and post-bake was performed after development. The pre-baking temperature (maximum temperature) was set to 130° C., and the pre-baking treatment time was set to 60 seconds. The post-baking temperature (maximum temperature) was set to 120° C., and the post-baking treatment time was set to 60 seconds.

First, the use of a dummy substrate was examined. The results of the examination of the use of a dummy substrate will be described below.

Examination 1

In Examination 1, the treatment of the first evaluation substrate was performed twice in succession without using a dummy substrate. In Examination 1, the trench width of a first evaluation substrate A in the first run and the trench width of a first evaluation substrate B in the second run were measured, and the difference between the measured trench widths was determined. The results are shown in Table 1 below. In Table 1 below, it is shown that the process proceeds in the direction from the column of Examinations 1 and 2 toward the column of Evaluation results.

Examination 2

In Examination 2, the treatment of the first evaluation substrate was performed twice in succession after the treatment of the dummy substrate 1 was performed. In Examination 2, the trench width of a first evaluation substrate A in the first run and the trench width of a first evaluation substrate B in the second run were measured, and the difference between the measured trench widths was determined. The results are shown in Table 1 below.

As shown in Table 1 below, when only the first photosensitive composition was used and the dummy substrate was not used, the difference in measured values was large, and when the dummy substrate was used, the difference in measured values was small, confirming that the measured values varied when the dummy substrate was not used. Therefore, when two different compositions are evaluated, it is necessary to perform the evaluation after a process using a dummy substrate is performed.

Next, Examples 1 to 9 and Comparative Example 1 will be described.

In Examples 1 to 9 and Comparative Example 1, the trench width of the first evaluation substrate and the trench width of the second evaluation substrate were measured, and the difference between the measured trench widths was determined. The results are shown in Table 2 below. In Table 2 below, "-" in the columns of First steps and the column of Fifth step indicates that the step is not performed. In Table 2 below, it is shown that the process proceeds in the direction from the column of Examples 1 to 9 and Comparative Example 1 toward the column of Evaluation results.

Example 1

In Example 1, after the treatment of the dummy substrate 1 (first step) was performed twice in succession, the treatment of the first evaluation substrate (second step) was performed, and the treatment of the second evaluation substrate (third step) was performed.

The time period between the treatment of the first evaluation substrate (second step) and the treatment of the second evaluation substrate (third step) was set to 10 minutes. The time period between the treatment of the first evaluation substrate (second step) and the treatment of the second evaluation substrate (third step) was measured using a timepiece.

The start time of the time period between the treatment of the first evaluation substrate (second step) and the treatment of the second evaluation substrate (third step) was defined as the point in time when the entire first evaluation substrate came out of the exposure unit as described above.

Example 2

Example 2 was the same as Example 1 except that the treatment of the dummy substrate 2 (fifth step) was performed between the treatment of the first evaluation substrate (second step) and the treatment of the second evaluation substrate (third step).

Example 3

Example 3 was the same as Example 1 except that the time period between the treatment of the first evaluation substrate (second step) and the treatment of the second evaluation substrate (third step) was set to 7 minutes.

TABLE 1

| Table 1 | First step | | Second step (1st run) | | Second step (2nd run) | | Evaluation results |
|---|---|---|---|---|---|---|---|
| | Substrate | The number of substrates treated | Substrate | The number of substrates treated | Substrate | The number of substrates treated | Difference (nm) in measured values between first evaluation substrates A and B |
| Examination 1 | — | — | First evaluation substrate A | 1 | First evaluation substrate B | 1 | 1.1 |
| Examination 2 | Dummy substrate 1 | 1 | First evaluation substrate A | 1 | First evaluation substrate B | 1 | 0.3 |

Example 4

Example 4 was the same as Example 1 except that in each of the two treatments of the dummy substrate 1 (first step), two dummy substrates 1 were treated at a time.

Example 5

Example 5 was the same as Example 1 except that in the treatment of the first evaluation substrate (second step), two first evaluation substrates were treated at a time.

Example 6

Example 6 was the same as Example 1 except that in the treatment of the second evaluation substrate (third step), two second evaluation substrates were treated at a time.

Example 7

Example 7 was the same as Example 1 except that the treatment of the dummy substrate 1 (first step) was performed once.

Example 8

Example 8 was the same as Example 2 except that the treatment of the dummy substrate 1 (first step) was performed once.

Example 9

Example 9 was the same as Example 2 except that in each of the two treatments of the dummy substrate 1 (first step), the treatment of the first evaluation substrate (second step), the treatment of the second evaluation substrate (third step), and the treatment of the dummy substrate 2 (fifth step), two substrates were treated at a time.

Comparative Example 1

Comparative Example 1 was performed without using the dummy substrate 1 and with the time period between the treatment of the first evaluation substrate (second step) and the treatment of the second evaluation substrate (third step) set to 10 minutes.

TABLE 2

| Table 2 | First step (1st run) | | First step (2nd run) | | Second step | | Fifth step | |
|---|---|---|---|---|---|---|---|---|
| | Substrate | The number of substrates treated | Substrate | The number of substrates treated | Substrate | The number of substrates treated | Substrate | The number of substrates treated |
| Example 1 | Dummy substrate 1 | 1 | Dummy substrate 1 | 1 | First evaluation substrate | 1 | — | — |
| Example 2 | Dummy substrate 1 | 1 | Dummy substrate 1 | 1 | First evaluation substrate | 1 | Dummy substrate 2 | 1 |
| Example 3 | Dummy substrate 1 | 1 | Dummy substrate 1 | 1 | First evaluation substrate | 1 | — | — |
| Example 4 | Dummy substrate 1 | 2 | Dummy substrate 1 | 2 | First evaluation substrate | 1 | — | — |
| Example 5 | Dummy substrate 1 | 1 | Dummy substrate 1 | 1 | First evaluation substrate | 2 | — | — |
| Example 6 | Dummy substrate 1 | 1 | Dummy substrate 1 | 1 | First evaluation substrate | 1 | — | — |
| Example 7 | Dummy substrate 1 | 1 | — | — | First evaluation substrate | 1 | — | — |
| Example 8 | Dummy substrate 1 | 1 | — | — | First evaluation substrate | 1 | Dummy substrate 2 | 1 |
| Example 9 | Dummy substrate 1 | 2 | Dummy substrate 1 | 2 | First evaluation substrate | 2 | Dummy substrate 2 | 2 |
| Comparative Example 1 | — | — | — | — | First evaluation substrate | 1 | — | — |

| Table 2 | Third step | | | Evaluation results Difference (nm) in |
|---|---|---|---|---|
| | Substrate | The number of substrates treated | Time period (min) between second step and third step | measured values between first evaluation substrate and second evaluation substrate |
| Example 1 | Second evaluation substrate | 1 | 10 | 0.3 |

TABLE 2-continued

| | | | | |
|---|---|---|---|---|
| Example 2 | Second evaluation substrate | 1 | 10 | 0.1 |
| Example 3 | Second evaluation substrate | 1 | 7 | 0.5 |
| Example 4 | Second evaluation substrate | 1 | 10 | 0.5 |
| Example 5 | Second evaluation substrate | 1 | 10 | 0.5 |
| Example 6 | Second evaluation substrate | 2 | 10 | 0.5 |
| Example 7 | Second evaluation substrate | 1 | 10 | 0.5 |
| Example 8 | Second evaluation substrate | 1 | 10 | 0.3 |
| Example 9 | Second evaluation substrate | 2 | 10 | 0.8 |
| Comparative Example 1 | Second evaluation substrate | 1 | 10 | 1.2 |

As shown in Table 2, in Examples 1 to 9, as compared with Comparative Example 1, the variation in measured values was reduced by using the dummy substrates. Thus, the difference in performance between the first photosensitive composition and the second photosensitive composition having exactly the same composition can be evaluated.

The comparisons of Example 1 with Example 2 and Example 7 with Example 8 show that when the treatment of the dummy substrate 2 (fifth step) is performed between the treatment of the first evaluation substrate (second step) and the treatment of the second evaluation substrate (third step), the variation in measured values can advantageously be further reduced.

The comparison of Example 1 with Example 3 shows that when the time period between the treatment of the first evaluation substrate (second step) and the treatment of the second evaluation substrate (third step) is 8 minutes or more, the variation in measured values can advantageously be further reduced.

The comparisons of Example 1 with Examples 4, 5, and 6 and Example 2 with Example 9 show that when the number of substrates to be treated is one, the variation in measured values can advantageously be further reduced.

The comparison of Example 1 with Example 7 shows that when the treatment of the dummy substrate 1 (first step) is performed a plurality of times, the variation in measured values can advantageously be further reduced.

REFERENCE SIGNS LIST

10 support substrate
10a surface
11 dummy substrate
12 first evaluation substrate
14 second evaluation substrate
15 first photosensitive composition layer
16 second photosensitive composition layer
17 first resin composition layer
18 second resin composition layer
17A, 18A opening
19 pattern
20 treatment device group
22 exposure unit
24 heating unit
26 development unit
H direction
Lv exposure light
S10, S11, S12, S13, S14, S16 Step

What is claimed is:

1. A method for inspecting a photosensitive composition, comprising:
    a first step of performing exposure treatment, heat treatment, and development treatment in this order on a dummy substrate including a first photosensitive composition layer formed using a first photosensitive composition;
    a second step of performing exposure treatment, heat treatment, and development treatment under the same conditions as in the first step on a first evaluation substrate including the first photosensitive composition layer to form a pattern;
    a third step of performing exposure treatment, heat treatment, and development treatment under the same conditions as in the first step on a second evaluation substrate including a second photosensitive composition layer formed using a second photosensitive composition to form a pattern; and
    a fourth step of determining whether a difference between a dimension of the pattern obtained in the second step and a dimension of the pattern obtained in the third step is within an acceptable range,
    wherein the first photosensitive composition and the second photosensitive composition are compositions including the same materials and produced in different lots.

2. The method for inspecting a photosensitive composition according to claim 1, comprising, between the second step and the third step, a fifth step of performing exposure treatment, heat treatment, and development treatment under the same conditions as in the first step in this order on a dummy substrate including the second photosensitive composition layer.

3. The method for inspecting a photosensitive composition according to claim 2, wherein the fifth step is a step of exposing the dummy substrate including the second photosensitive composition layer in an exposure unit under the same conditions as in the first step, heating the exposed dummy substrate in a heating unit under the same conditions as in the first step, and developing the heated dummy substrate in a development unit under the same conditions as in the first step.

4. The method for inspecting a photosensitive composition according to claim 3, wherein the number of the dummy substrate treated in the exposure unit, the heating unit, and the development unit in the fifth step is one.

5. The method for inspecting a photosensitive composition according to claim 3, wherein a time period between the second step and the third step is 8 minutes or more.

6. The method for inspecting a photosensitive composition according to claim 3, wherein the first step is performed a plurality of times.

7. The method for inspecting a photosensitive composition according to claim 2, wherein a time period between the second step and the third step is 8 minutes or more.

8. The method for inspecting a photosensitive composition according to claim 2, wherein the first step is performed a plurality of times.

9. The method for inspecting a photosensitive composition according to claim 1, wherein the first step is a step of exposing the dummy substrate including the first photosensitive composition layer in an exposure unit, heating the exposed dummy substrate in a heating unit, and developing the heated dummy substrate in a development unit, the second step is a step of exposing the first evaluation substrate including the first photosensitive composition layer in the exposure unit under the same conditions as in the first step, heating the exposed first evaluation substrate in the heating unit under the same conditions as in the first step, and developing the heated first evaluation substrate in the development unit under the same conditions as in the first step to form a pattern, and the third step is a step of exposing the second evaluation substrate including the second photosensitive composition layer in the exposure unit under the same conditions as in the first step, heating the exposed second evaluation substrate in the heating unit under the same conditions as in the first step, and developing the heated second evaluation substrate in the development unit under the same conditions as in the first step to form a pattern.

10. The method for inspecting a photosensitive composition according to claim 9, wherein the number of the dummy substrate treated in the exposure unit, the heating unit, and the development unit in the first step is one.

11. The method for inspecting a photosensitive composition according to claim 9, wherein the number of the first evaluation substrate treated in the exposure unit, the heating unit, and the development unit in the second step is one.

12. The method for inspecting a photosensitive composition according to claim 9, wherein the number of the second evaluation substrate treated in the exposure unit, the heating unit, and the development unit in the third step is one.

13. The method for inspecting a photosensitive composition according to claim 9, wherein a time period between the second step and the third step is 8 minutes or more.

14. The method for inspecting a photosensitive composition according to claim 9, wherein the first step is performed a plurality of times.

15. The method for inspecting a photosensitive composition according to claim 1, wherein a time period between the second step and the third step is 8 minutes or more.

16. The method for inspecting a photosensitive composition according to claim 1, wherein the first step is performed a plurality of times.

17. A method for producing a photosensitive composition, comprising the method for inspecting a photosensitive composition according to claim 1.

18. A method for producing a photosensitive composition, comprising the method for inspecting a photosensitive composition according to claim 2.

19. A method for producing a photosensitive composition, comprising the method for inspecting a photosensitive composition according to claim 9.

20. A method for producing a photosensitive composition, comprising the method for inspecting a photosensitive composition according to claim 3.

* * * * *